METHOD OF MAKING DIFFUSED SEMICONDUCTOR DEVICES

Filed Jan. 28, 1965 Sheet 1 of 4

INVENTORS
Doyle S. Granberry,
Robert L. McCalip,
Byron K. Lovelace
BY John G. Graham

METHOD OF MAKING DIFFUSED SEMICONDUCTOR DEVICES

Filed Jan. 28, 1965

INVENTORS
Doyle S. Granberry,
Robert L. McCalip,
Byron K. Lovelace

BY [signature]

INVENTORS
Doyle S. Granberry,
Robert L. McCalip,
Byron K. Lovelace

BY John D. Graham

INVENTORS
Doyle S. Granberry,
Robert L. McCalip,
Byron K. Lovelace
BY John D. Graham United States Patent Office 3,431,636
Patented Mar. 11, 1969

3,431,636

METHOD OF MAKING DIFFUSED SEMICONDUCTOR DEVICES

Doyle S. Granberry and Robert L. McCalip, Dallas, and Byron K. Lovelace, Austin, Tex., assignors to Texas Instruments Incorporated, Dallas, Tex., a corporation of Delaware Filed Jan. 28, 1965, Ser. No. 428,682
U.S. Cl. 29—578 12 Claims
Int. Cl. H01l 7/00; B01j 17/00

ABSTRACT OF THE DISCLOSURE

Process for producing a planar passivated germanium semiconductor device by a series of masking and etching steps, including deposition of a silicon oxide layer on the surface of a germanium wafer, accompanied by appropriate application of conductivity type determining impurities, and also including formation of a germanium oxide passivating layer intermediate the germanium surface and the deposited silicon oxide layer.

This invention relates to production methods for semiconductor devices, and more particularly to methods applicable to the manufacture of germanium transistors of the type having diffused regions.

For operation at high frequency, a transistor must be of small physical dimensions in the actual operating parts of the emitter, base and collector regions, and the base width must be narrow and controlled to tight tolerances. At frequencies in the 5 gc. range or greater, the area of the emitter region, for example, is preferably smaller than a few tenths of a square mil. This imposes dimensional tolerances which make conventional fabrication procedures for germanium transistors unsuitable. The metal masks ordinarily employed in evaporating emitter and base stripes are unwieldy when working with these small dimensions, and are not suited for complex geometries. The use of alloy dots of this size is impractical as a production method because of the extreme small size, a sphere of ¼ mil diameter, for example, being invisible to the naked eye and virtually impossible to handle with ordinary production aids such as tweezers. Even if alloyed emitters could be produced at such small dimensions, the problem of making contact to the emitter would still exist.

In the manufacture of silicon transistors and integated circuits, the combination of silicon oxide masking and photoengraving techniques has permitted wide latitude in device geometries and allowed the size of operating regions to be reduced to the general range necessary for extremely high frequencies. Silicon has undesirable electrical characteristics at high frequencies, however, the carrier mobilities being only one-third to one-fourth that of germanium.

Even though germanium would be preferable for high frequency devices, it has not been heretofore possible to employ the advantageous photomasking techniques for defining the junction and contact areas. Germanium oxide is not a good diffusion mask, and in addition sublimes at fairly low temperatures. While it has been recognized that silicon oxide can be applied to a germanium surface then selectively etched away to create the diffusion mask, this technique has not been employed because of the degraded device characteristics which result. This degradation is believed to be due to the presence of unbound germanium beneath the silicon oxide coating, as will be explained hereinafter. Also, there has been no successful technique for depositing small-geometry contacts or electrodes on germanium devices in a manner similar to that used in silicon planar technology. Furthermore, the small device geometries require the use of expanded contacts to facilitate bonding of lead wires, thus making it necessary to cover the device with an insulating material after the contacts are alloyed into the surface. Unfortunately, the preferable insulating material, silicon oxide, had to be applied at high temperatures if impervious coatings were needed, thus degrading the device by causing further diffusion or alloying in the regions or contacts.

It is therefore the principal object of this invention to provide a method of making an improved transistor which is of small geometry and otherwise adapted for operation at high frequency, but yet is of a form which facilitates mass production. Another object is to provide a method of making a planar germanium transistor with expanded contacts. A further object is to provide a method for passivating a germanium device in the area where a p-n junction extends to the surface.

In accordance with a preferred embodiment of this invention, a unique combination of processing steps, some of which have not been heretofore available, is employed in the manufacture of germanium transistors. Silicon oxide masking is used for selective diffusion of the transistor base region, then the base and emitter contacts or electrodes are applied by photoresist masking operations which employ two separate selective coatings of resist. Silicon oxide may be used to confine the areas occupied by the base and emitter electrodes. Also, silicon oxide is used to cover the base and emitter metals after completion of the high temperature diffusion and alloying operations, but this oxide is deposited at a low temperature which does not affect the characteristics of the device. A germanium oxide passivating layer is restored to the area over the edge of the base-collector junction at the surface, this being beneath the oxide masking used for the base diffusion.

The novel features believed characteristics of this invention are set forth in the appended claims. The invention itself, however, as well as other objects and advantages thereof, will best be understood by reference to the following detailed description of an illustrative embodiment, when read in conjunction with the accompanying drawing, wherein:

Figure 1:
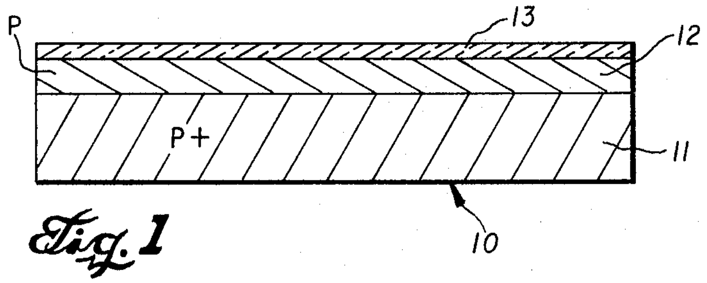
FIGURE 1 is an elevational view in section of a semiconductor wafer in an early stage of the process of this invention.

The starting material for making transistors according to this invention is a slice of germanium, about four mils thick, preferably cut on the 1–1–1 plane, having a lightly doped epitaxial layer thereon. As seen in FIGURE 1, one transistor would be made from a chip or wafer 10 having a substrate portion 11 heavily doped with acceptor impurities, resistivity perhaps 0.005Ω cm., and an epitaxially grown layer 12. The layer 12 is about one to ten microns in thickness, and the resistivity of this layer is about 2Ω cm. The wafer 10 is actually only a small undivided part of a slice which remains intact through all of the operations which are described below until it is scribed and broken just before the units are mounted in individual packages. The thicknesses and resistivities used in the starting material are selected according to the desired electrical specifications for the completed transistor.

The germanium slices are first coated with a material which functions as a diffusion mask. In accordance with this invention, a silicon oxide coating 13 is applied to the top surface of the slice or wafer by a pyrolytic type deposition operation employing apparatus as seen schematically in FIGURE 2. A plurality of germanium slices 14, each containing hundreds of the wafers 10 in undivided form, are placed in a boat 15 within a tube furnace 16. The temperature in the furnace is closely controlled by heating coils 17 and a feedback control arrangement not shown. Silicon oxide is caused to be deposited on the slices 14 by providing an atmosphere of materials which produce a disproportionation reaction. To this end, a quantity of a silane such as liquid tetraethylorthosilicate or tetraethoxysilane is placed in a flask 18 and oxygen is bubbled through by forcing the gas through an inlet 19, down into the liquid, and out through conduits 20 and 21. The flow of this vapor is maintained sufficiently high to flush out any other gases in the tube furnace. Prior to the beginning of the deposition, the tube furnace may be purged by forcing large quantities of a gas such as hydrogen or argon from an inlet 22 into the tube, manipulating valves 23, 24 and 25 accordingly. During the deposition operation, additional oxygen may be introduced through the inlet 22.

It should be emphasized at this point that the oxide deposition procedure according to the method of this invention is carried out at much lower temperatures than heretofore practical. Ordinarily, the gas used to carry the silane vapor into the furnace is nitrogen or the like, and the reaction and deposition of silicon oxide occurs due to a high temperature in the furnace. The furnace temperature may be 600 to 700° C. or more in the conventional procedure. At these temperatures, diffusion of the impurities which may be in the slice occurs rather rapidly. The reaction time might be twenty minutes, during which a junction may migrate several hundredths of a mil, which in a device of the type contemplated here could ruin the device for high performance purposes. In contrast to the prior techniques, the deposition operation used with this invention employs a temperature within the furnace 16 in the range of 300 to 450° C., which is a reasonably low temperature when compared to the temperatures at which diffusion of impurities occurs in germanium. This low temperature is permitted by making use of oxygen as the carrier gas, in which case the oxygen does not function merely to carry the silane vapor into the furnace, but also to aid in the reaction.

While at this point in the process the slices are not as vulnerable to high temperature operations as is true after the emitter and base alloy-diffusion step, it is still preferable to employ a low temperature oxide deposition because of the great difference in thermal expansion coefficients exhibited by silicon oxide and germanium. This difference causes bowing of the slice which is detrimental to alignment of photomasks in subsequent operations and may cause physical damage to the slice or oxide layer.

Figure 3:
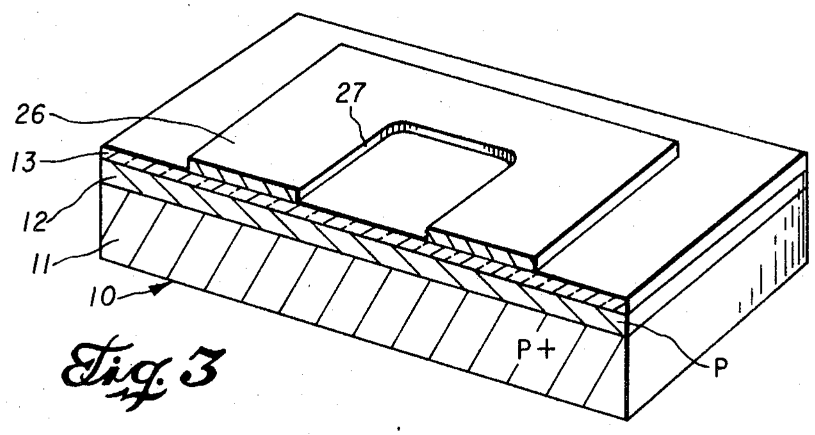
FIGURE 3 is a pictorial view in section of the wafer of FIGURE 1 in a subsequent stage in manufacture.
Figure 4:
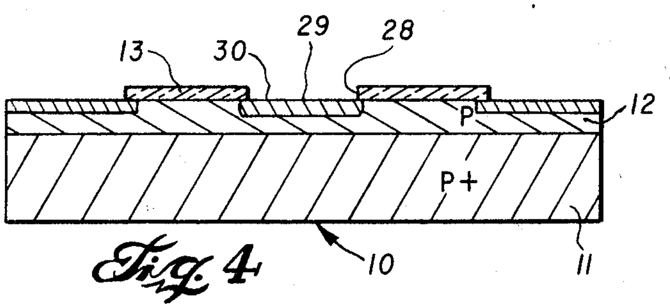
FIGURE 4 is an elevational view in section of the wafer of FIGURE 3 in a later stage of manufacture.

After the silicon oxide coating 13 is applied, the slices are removed from the furnace 16 and a coating 26 of a photoresist material is applied to the top surface as seen in FIGURE 3. The photoresist is for the purpose of selectively removing the oxide 13 for diffusion of the base region of the transistor. Accordingly, the coating 26 is exposed to light through a mask which allows all of the coating to be exposed except for an outline of the base region. The photoresist is then developed in a photoresist developer, such as trichloroethylene, leaving an opening 27 which exposes the silicon oxide 13 where it is to be etched away. The slice is immersed in an etchant such as buffered HF to remove the oxide in the opening 27, leaving a hole 28 which exposes a portion 29 of the germanium surface of the same size and shape as the opening 27. Also, it will be noted that a peripheral region of the oxide layer 13 is removed surrounding the opening 28. This peripheral region is spaced away from any of the regions which function as the completed transistor, and so oxide or lack of it here will in no way affect the device. The purpose for removing oxide in this peripheral area is to reduce the effects of the difference in thermal expansion of silicon oxide and germanium, and to increase the area of bare germanium exposed to the arsenic vapor during the base diffusion to produce improved characteristics of the diffused region as set forth in the copending application Ser. No. 410,372, filed Nov. 12, 1964. Referring now to FIGURE 4, the photoresist layer 26 is removed by rinsing in a solvent such as dichloromethane, and the slices are subjected to a diffusion operation to produce a shallow N-type region 30 which forms the base contact region for each transistor. The N-type impurity also diffuses into the surface of the wafer around the periphery, but this diffused region performs no function in the completed device as noted above.

Figure 5:
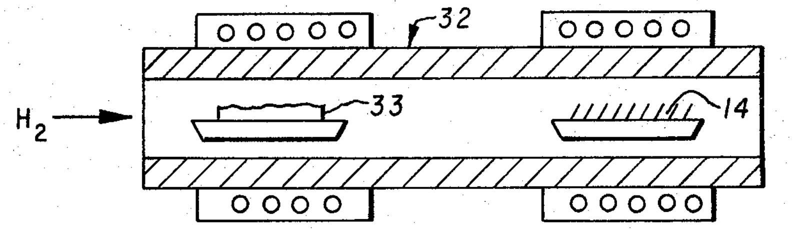
FIGURE 5 is an elevational view, partly in section, of apparatus for carrying out the diffusion step used in this invention.

The N-type region 30 is formed in each undivided wafer of a slice by placing the slices 14 in a diffusion furnace 32 as seen in FIGURE 5 with a quantity of arsenic 33. A carrier gas such as hydrogen passes through the furnace, and the temperature of the arsenic source 33 is maintained at about 350° C. while the slices are maintained at about 700° C. by means of two separate heaters and temperature controls. About one-half hour is needed for this diffusion, the resulting junction depth being about 0.05 mil. The slices are removed from the furnace at this point and an oxidation procedure employed to restore the germanium oxide surface passivation, this being vital to the transistors of this invention. This step may well be postponed until after all high temperature operations are performed on the wafer, or repeated at that time.

Figure 6:
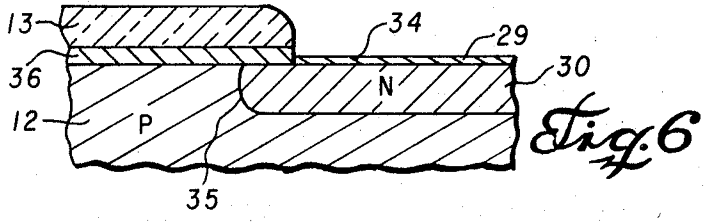
FIGURE 6 is a greatly enlarged elevational view in section of a portion of the wafer of FIGURE 4 after one of the processing steps of this invention has been performed thereon.

A clean germanium surface, if exposed to air or oxygen, will form a very thin coating of germanium oxide thereon. This coating, which is thought to be primarily germanium monoxide but also to contain germanium dioxide, is necessary for good operation of the complete device. However, since the slice has been subjected to diffusion temperatures of about 700° C. in forming the base region 30, a significant amount of the germanium oxide has sublimed, not only from the exposed germanium surface portion 29 but also beneath the silicon oxide layer 13. When the slice is exposed to air after removing from the diffusion furnace, the germanium oxide will reform on the exposed surface 29, producing a very thin coating 34 as seen in the greatly enlarged sectional view of FIGURE 6. Unfortunately, the germanium oxide will not reform underneath the silicon oxide layer 13. The place where the germanium oxide is needed is at the point where the junction 35 intersects the top surface of the wafer, this being beneath the silicon oxide 13. Accordingly, the slice is subjected to an oxidation procedure at some point in the process after the base diffusion operation. This oxidation procedure may consist of maintaining the slice in air or oxygen at an elevated temperature for a suitable period of time, diffusing oxygen through the silicon oxide to combine with germanium at the wafer surface. For example, in an atmosphere of oxygen at 250° C., the desired thickness of germanium oxide is formed in four hours, while at 450° C. only 30 minutes is needed. A layer 36 of germanium oxide is thus formed beneath the silicon oxide 13, and this layer 36 may be thicker than the layer 34 on bare germanium. This is because the germanium oxide is self-limiting in thickness on unprotected germanium since the unbound oxide over the initial molecular layer which is bound to the germanium atoms will easily volatilize at ordinary processing or operating temperatures. Under the silicon oxide 13, the germanium oxide can build up to considerable thickness, perhaps 200 A., which is probably substantially more than that on bare germanium. This germanium oxide over the junction contributes significantly to the quality of the device.

The slices are now subjected to another low temperature silicon oxide deposition operation as described above with reference to FIGURE 2. A layer 37 of silicon oxide of about 1500 A. in thickness is thus formed over the previous layer 13 and over the region 30. It is important to note that the thickness of the oxide layer 37 is much less than ordinarily used for diffusion masking and the like. This layer 37 is intentionally thin to avoid reaction with aluminum in the layer to be subsequently deposited.

Figure 7:
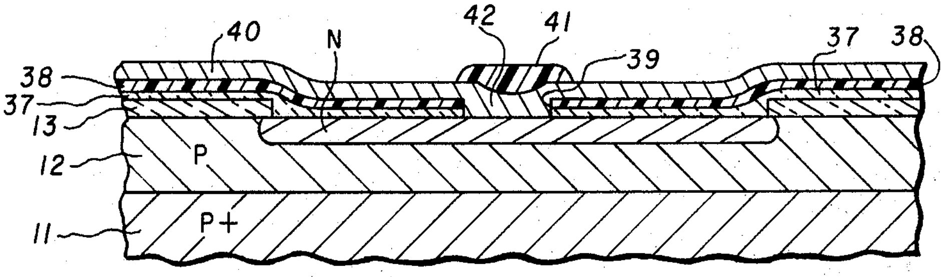
FIGURES 7, 8 and 10 are enlarged elevational views in section of a portion of the wafer of FIGURE 4 at various successive manufacturing stages.
Figure 8:
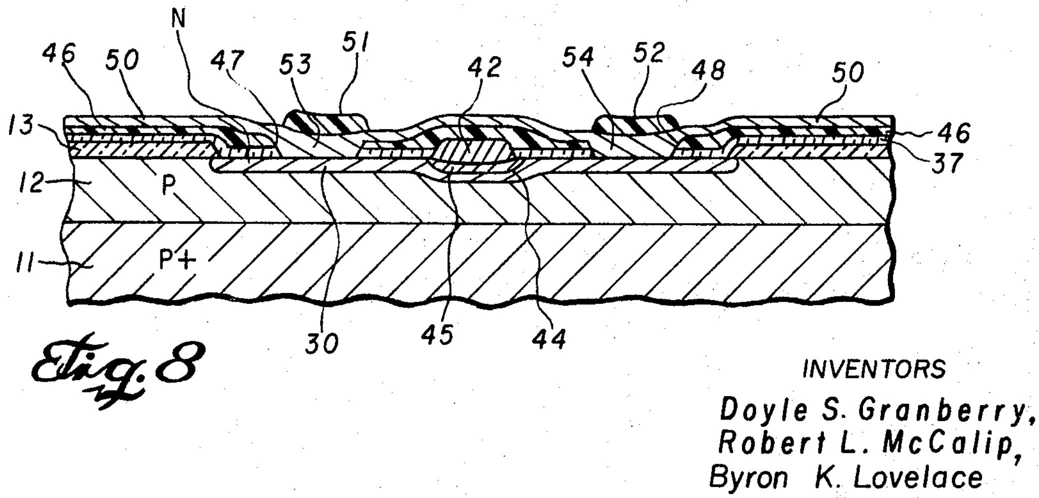

The slices with the base region formed by diffusion and the layer 37 in place are now coated with a photoresist layer 38 as seen in FIGURE 7, and an opening 39 is formed, by masking, exposing to light, and developing, in the area where the emitter metal is to be placed. The oxide beneath the opening 39 is removed by a suitable etchant, and the entire top surface is then coated with a layer 40 of the emitter material by evaporation techniques.

The composition of the emitter material is very important and will be described in detail. Preferably, the emitter material is predominantly aluminum with small quantities of a fast diffusing donor impurity such as antimony or arsenic and a slow diffusing acceptor such as gallium or indium or both. Part of the aluminum may be replaced by silver, but the composition should be at least about one-fourth aluminum, which in any case is a major constituent because of the propensity of aluminum for dissolving germanium, the solid solubility being about $4\times10^{20}$ cm.$^{-3}$. In the subsequent alloy-diffusion operation, the aluminum functions, among other things, as a carrier metal; i.e., it dissolves germanium and carries the donor and acceptor impurities into the melted region whereas the impurities alone would not penetrate nearly as far because of the good wetting and solubility properties of aluminum. The aluminum also serves as the predominant acceptor in the emitter regrowth region which is to be formed. The gallium and/or indium is believed to be the majority acceptor diffusing impurity during subsequent formation of the emitter-base diode.

When layer 40 of emitter material is evaporated onto the slice, the elements aluminum, gallium and antimony may deposit in inverse-order on the wafer surface, viz. antimony first, then gallium, then aluminum, because of the relative vapor pressures of these elements. Preferably, the emitter material is evaporated very rapidly to produce a homogeneous deposited layer 40. If greater control of donor and acceptor concentrations is desired, the various constituents of the layer 40 may be sequentially evaporated from separate sources to produce superimposed layers. In any event, the evaporation step is ordinarily carried out in an evacuated chamber wherein the emitter composition is placed on a tungsten filament or within a tantalum boat which is spaced from the surface of the slices. Upon energization of the filament with electric current, the quantity or charge of emitter material is heated until it melts, volatilizes, and deposits upon the slices, creating the layer 40.

After removing from the evaporation chamber, the layer 40 is selectively removed by coating the top surface of the slice with photoresist, exposing to light through a mask, then developing, leaving a segment 41 of photoresist, referred to as a "top hat." The slice is now subjected to an etchant such as 17% phosphoric acid with 3% nitric acid and 15% acetic acid, remainder water, to remove the layer 40 except underneath the segment 41. The photoresist layer 38 and segment 41 are then removed by a solvent, dichloromethane, leaving a stripe 42 of the emitter material. The slice is now subjected to an alloy-diffusion operation, wherein the emitter material 42 is melted at a temperature of about 700° C. by placing the slice in a tube furnace in an atmosphere of gas such as hydrogen. The molten emitter material dissolves germanium until the saturation point is reached, the maximum temperature reached determining the penetration of the emitter alloy. The temperature of the slice is reduced slightly from the maximum, and germanium begins to freeze out to form a regrowth region doped with aluminum, gallium and antimony. The fast diffusing impurity, antimony, penetrates into the layer 12 to create a base region 44. The time and temperature of this operation determine the base width or the thickness of the region 44. Typically, the time would be ten minutes at the 700° C. level. After the selected time, the slice is cooled by removing from the furnace or by lowering the furnace temperature. The melt solidifies and forms a regrowth region 45 of single crystal P-type germanium. Above the regrowth region, the remainder of the resolidified emitter stripe 42 is composed of the emitter metal mixed with germanium, this part merely functioning as an ohmic contact to the emitter region 45. The oxide layer 37 performs a vital function during the alloy-diffusion operation by containing the melted emitter stripe. This is particularly important when the geometry of the device is quite small, i.e., if the width of the emitter stripe, for example, is only perhaps 0.2 mil.

After the emitter alloy-diffusion operation is completed, the base contact stripes are applied by photoresist techniques as described above relative to the emitter stripe. To this end, a coating 46 of photoresist polymer is applied to the top of the slice, and a pair of openings 47 and 48 are cut by exposing through a mask and developing. The portions of the oxide layer 37 beneath the openings 47 and 48 are removed by a suitable etchant. The base contact material is applied as a coating 50 over the entire top surface of the slice, and is preferably composed of silver, or a silver-gold alloy, containing in either case a donor impurity such as antimony, with the thickness of the coating being about 0.03 mil. Another coating of photoresist is applied over the metal coating 50 and removed except for two segments 51 and 52 superimposed over the openings 47 and 48. The metal coating 50 is etched away except where it is covered by the segments 51 and 52, then the photoresist is removed with a solvent, leaving a pair of base stripes 53 and 54.

Figure 9:
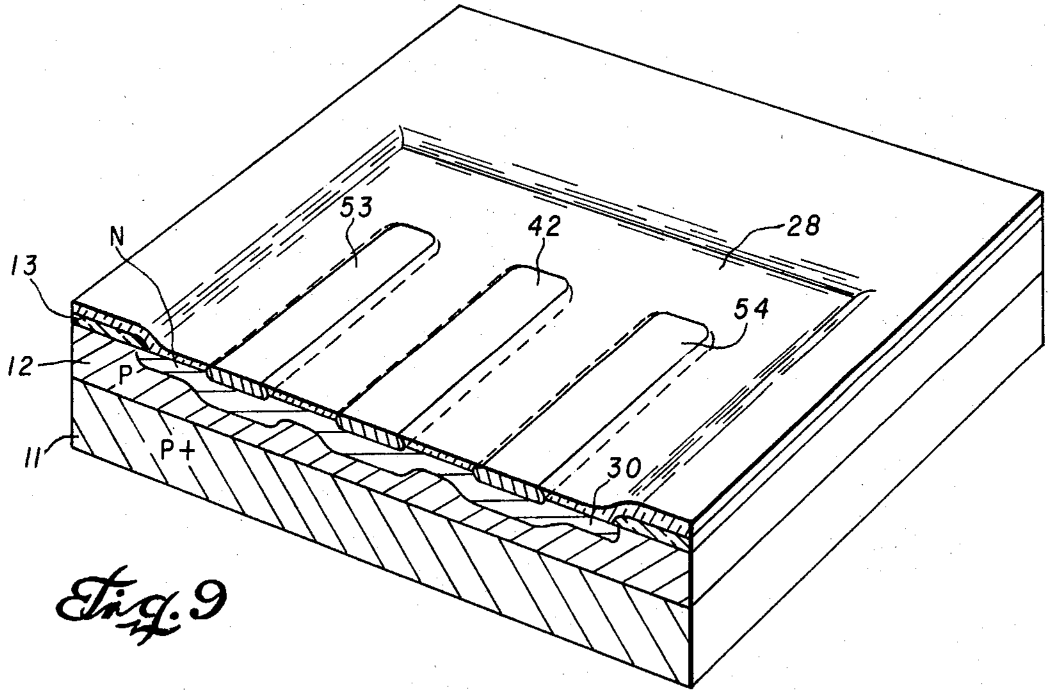
FIGURE 9 is a pictorial view in section of the device of FIGURE 8 after removal of masking material and alloying.
Figure 10:
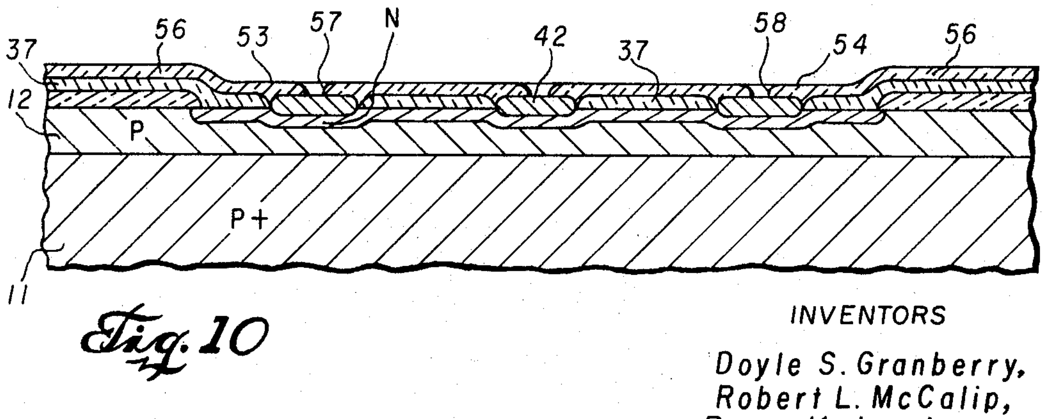

The base stripes are now alloyed into the germanium surface to produce good ohmic contact by heating the slice at 400° C. for 10 minutes. This temperature is below that at which alloy-diffusion takes place in the emitting stripe, and so no change is produced in the base width or emitter penetration. If the base contact stripes are applied first, the donor impurity in the base contact material may diffuse through the contact region 30 into the P-type epitaxial region 12 as seen in FIGURE 9. The long, narrow configuration of the base and emitter stripes appears in the view of FIGURE 9, illustrating the variety of contact geometries permitted by the techniques of this invention.

At this point, the unusual procedure which has been used to define the base and emitter stripes should be noted. Ordinarily, the lower coatings 38 and 46 of photoresist would not be used, but instead the contact metal would be deposited directly onto the semiconductor surface or on silicon oxide, and only the top coating of photoresist employed to selectively remove the metal, a technique quite suitable for use on planar silicon device with the contact metals ordinarily used. However, the alloy of metals used for the emitter material, and the base as well, cannot be readily removed from a silicon oxide coating on a germanium device. The technique of using the photoresist both above and below the metallization, preferably along with silicon oxide underneath, is quite successful.

As described thus far, the emitter stripe is deposited first and the emitter alloy-diffusion operation is carried out, then the base stripes are deposited and alloyed in at a low temperature. Alternatively, the base stripes could be deposited first, then alloyed into the wafer surface, then subsequently the emitter would be deposited and the emitter alloy-diffusion carried out. Also, instead of using two high temperature alloy operations, both emitter and base stripes could be alloyed in at the same time, the first to have been deposited having been tacked with a brief, low temperature alloy operation.

The photoresist material mentioned above may be of the type disclosed in U.S. Patents 2,670,285, 2,670,286, and 2,670,287 of L. M. Minsk, or preferably is a material commercially available from Eastman Kodak Company under the trademark "KMER."

While silicon oxide has been described above as the preferred material for use as a diffusion mask, other suitable material such as $Al_2O_3$ or a glass-like material could be used. Aluminum trioxide has the particular advantage that it does not react with aluminum, whereas silicon oxide does do so. In particular, silicon oxide may be used as the layer 13, $Al_2O_3$ as the layer 37, and silicon oxide as the top layer 56.

Figure 2:
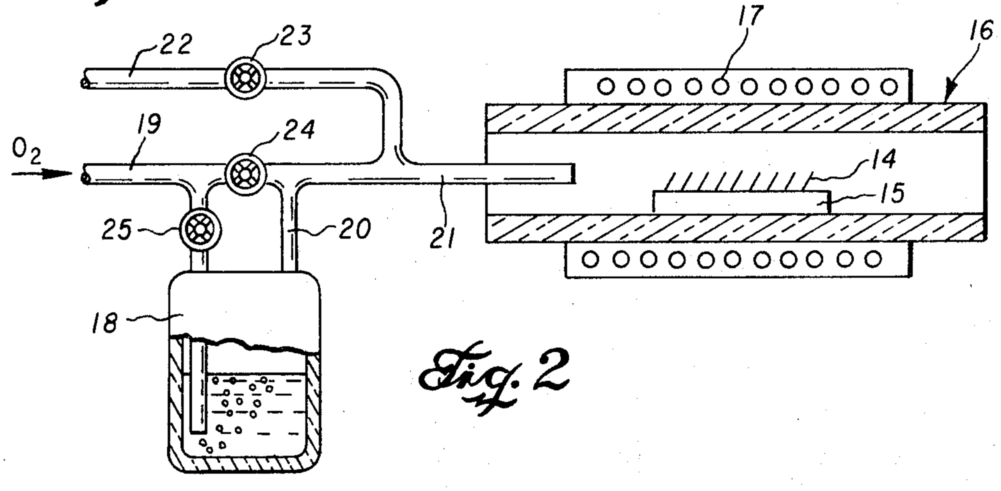
FIGURE 2 is a schematic representation of apparatus for applying the silicon oxide coatings used in this invention.
Figure 11:
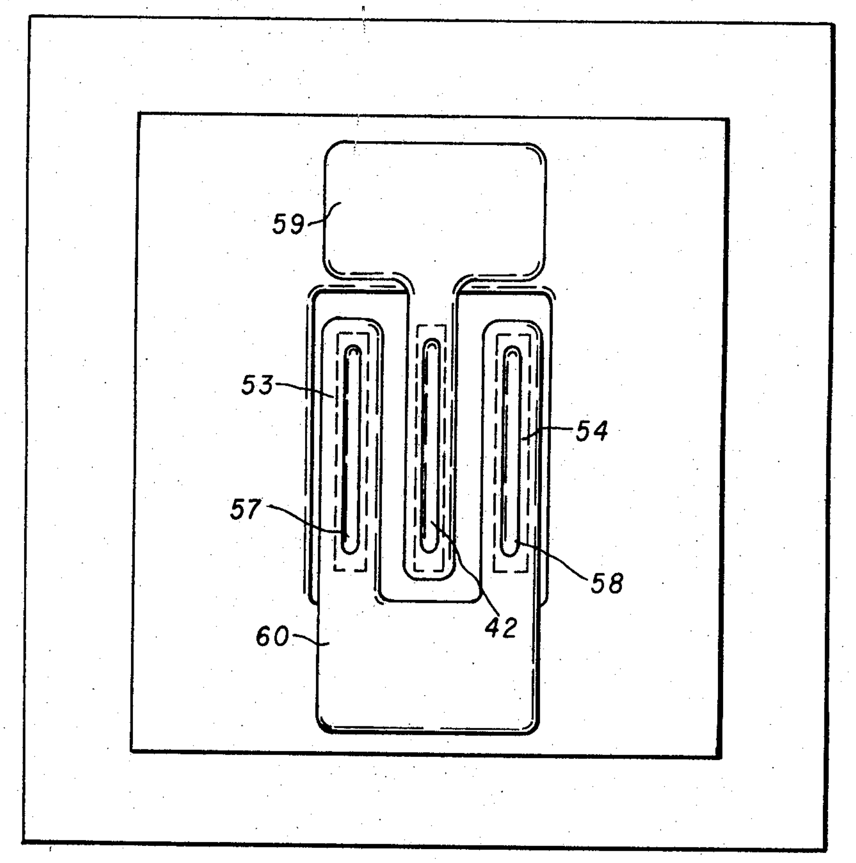
FIGURE 11 is a greatly enlarged plan view of a completed transistor wafer made according to this invention.

The slice with base and emitter stripes alloyed, as seen in FIGURE 9, is now coated with a silicon oxide layer 56 by the low temperature deposition procedure set forth above with reference to FIGURE 2. It is vitally important that this deposition operation be at a temperature far below the alloying or diffusion temperatures for the base and emitter impurities, since any migration of the junctions or regions at this stage in the operation would eliminate any tight control over the device characteristics. A pair of small holes 57 and 58 are opened over the base stripes 53 and 54 by photoresist masking and etching, while at the same time a single small hole is opened over the emitter stripe 42. The top of the slice is now coated with aluminum by evaporation techniques, with the aluminum thickness being perhaps several microns, and the aluminum coating is selectively removed in unwanted areas by photoresist masking and etching. The pattern of expanded contacts which remains is seen in FIGURE 11, wherein an emitter contact 59 and a base contact 60 extend out over the oxide coating 56 to provide wide areas for bonding emitter and base lead wires.

Construction of the transistor is completed by scribing the slice and breaking into a large number of the wafers 10. Each wafer is then mounted on a header or other suitable package by a solder material, with the region 11 contacting the header. Small wires are then thermocompression bonded to the pads 59 and 60 and to posts extending through the header. Encapsulation of the device is completed by sealing a can over the header.

While this invention has been described with reference to illustrative embodiments, it is understood that this description is not to be construed in a limiting sense. Other embodiments of the inventive concept, as well as modifications of the disclosed embodiments, will appear to persons skilled in the art. It is thus contemplated that the appended claims will cover any such embodiments or modifications as fall within the true scope of the invention.

What is claimed is:

1. A process for making a planar germanium semiconductor device having at least one p-n junction terminating at the surface of the semiconductor body, comprising forming a silicon oxide coating over said surface, etching to remove a portion of said silicon oxide coating and to expose a contact area within the region defined by said p-n junction, applying a coating of contact metal over said contact area and extending into engagement with said surface, and forming a germanium oxide layer under the silicon oxide coating and over the portion of the p-n junction terminating at said surface.

2. A process for making a planar germanium semiconductor device comprising coating a surface of a germanium wafer with a first coating of silicon oxide, defining a first, limited-area opening extending through said coating, diffusing a conductivity-determining impurity into the germanium wafer through said first opening to form a shallow region closely adjacent said face and separated from the remainder of the germanium wafer by a first p-n junction which extends to said surface beneath said first silicon oxide coating, applying a second silicon oxide coating over said surface of said germanium wafer, defining a second opening extending through said second silicon oxide coating in communicating with said shallow region, introducing conductivity-determining impurity material into said second opening to form a second p-n junction terminating at the surface of said germanium wafer, and forming a germanium oxide layer intermediate said first silicon oxide coating and said surface of said germanium wafer.

3. A process in accordance with claim 2 wherein said conductivity-determining impurity material is introduced by depositing a metal containing conductivity-determining material extending into said second opening and wherein said metal is fused into said second opening to form said second p-n junction.

4. A process in accordance with claim 3 wherein said metal comprises a composition of aluminum with relatively small quantities of a fast diffusing donor impurity and a slow diffusing acceptor impurity.

5. A process in accordance with claim 4 wherein said fast diffusing donor impurity is selected from the class consisting of antimony and arsenic and wherein the slow diffusing acceptor impurity is selected from the class consisting of gallium and indium.

6. In a process for making a planar germanium semiconductor device having a p-n junction terminating at a surface thereof, a method of applying contact metal to said germanium semiconductor surface comprising forming a coating of silicon oxide over said surface, coating the surface over the oxide with a first layer of photoresist, selectively removing a portion of said first layer of photoresist to thereby expose said contact area, removing the oxide in said contact area, applying a coating of contact metal over said first layer and extending into said contact area in engagement with the semiconductor surface, applying a second layer of photoresist over said contact metal, selectively removing a portion of said second layer of photoresist, whereby only said contact area remains coated by said second layer of photoresist, ethcing away the coating of contact metal except in said contact area, thereafter removing the remaining of the first and second layers of photoresist, and forming a germanium oxide layer under the silicon oxide coating and over the portion of the p-n junction terminating at said surface.

7. A method of making a transistor comprising coating a face of a germanium wafer with a first coating of silicon oxide, defining a limited-area opening in said coating, diffusing a conductivity-determining impurity material into the germanium wafer through said opening to form a shallow region closely adjacent said face separated from the remainder of the wafer by a p-n junction which extends to said face beneath said first silicon oxide coating, applying a second coating of silicon oxide to the face of the wafer, covering said face with a first coating of etch resistant material and defining a first small opening therein over said shallow region, etching away said second coating of silicon oxide beneath said small opening, depositing a metal containing conductivity-determining impurity material over said face and extending into said small opening, covering a small area of the deposited metal superimposed over said first small opening with a second coating of etch resistant material, etching away the deposited metal which remains exposed after said small area is covered by said second coating, fusing said metal into said shallow region to form an emitter region of the transistor, diffusing conductivity-determining impurity material from the emitter region through the shallow region to form a base region, forming a germanium oxide layer intermediate the area of emergence of said p-n junction at the face of said germanium wafer and said first coating of silicon oxide, and forming expanded base and emitter contacts.

8. A method in accordance with claim 7 wherein said expanded base and emitter contacts are formed by covering the face of the wafer with a third coating of etch resistant material and defining a second opening therein over the shallow region, etching away said second silicon oxide coating beneath said second opening, depositing base contact metal over said face, covering a small area of the deposited contact metal with a fourth coating of etch resistant material, removing the portion of the deposited contact metal which remains exposed after covering the small areas of the contact metal with said fourth coating, fusing the contact metal to the germanium to provide low resistance base contacts, depositing silicon oxide over said face at low temperature, defining small openings in the silicon oxide over the deposited metal of the emitter and over the base contact metal, and forming separate base and emitter expanded contacts over said silicon oxide extending into said small openings, the expanded contact areas being greater in size than the emitter region and base contacts.

9. A method in accordance with claim 7 wherein said germanium oxide layer is relatively thick and is formed by diffusing oxygen through said first coating of silicon oxide onto said wafer surface.

10. A method of making a planar germanium transistor comprising coating a face of a P-type germanium wafer with a first coating of silicon oxide, defining a limited-area opening in said first silicon oxide coating, diffusing a donor impurity material into the germanium through said opening to form a shallow N-type region closely adjacent said face separated from the remainder of the wafer by a p-n junction which extends to said face beneath said first silicon oxide coating, applying a second coating of silicon oxide to the face of the wafer, forming a germanium oxide layer intermediate the area of emergence of the p-n junction at the face of the wafer and the first silicon oxide coating, covering said face with a first coating of photoresist and defining a small opening therein over said N-type region, removing the second silicon oxide coating beneath said small opening by etching, depositing a carrier metal containing fast diffusing donor impurity material and slow diffusing acceptor impurity material over said face and into said small opening, covering a small area of the deposited metal superimposed over said small opening with a second coating of photoresist without removing said first coating of photoresist, etching away the portion of the deposited metal which remains exposed after covering said small areas of the deposited metal with said second coating of photoresist, fusing said metal through said shallow region to form an alloyed emitter region of the transistor and maintaining an elevated temperature to create a diffused N-type base region which is connected internally to said shallow N-type region, covering the face of the wafer with a third coating of photoresist and defining an opening therein over the shallow N-type region, removing the silicon oxide coating beneath said opening by etching, depositing base contact metal over said face, covering a small area of the deposited contact metal with a fourth coating of photoresist, without removing said third coating of photoresist, removing the portion of the deposited contact metal which remains exposed after covering said small area of the deposited metal contact with said second coating of photoresist, fusing the base contact metal to the germanium to provide low resistance base contacts, depositing silicon oxide over said face at a temperature substantially lower than used in diffusing said shallow region and in fusing said emitter metal defining small openings in the silicon oxide over the deposited metal of the emitter and over the base contact metal, and forming separate base and emitter expanded contacts over said silicon oxide extending into said small openings, the expanded contact areas being much greater in size than the emitter region and base contacts.

11. A method of making a transistor comprising the steps of coating a face of a germanum wafer with silicon oxide, defining a limited-area opening in said coating diffusing a conductivity-determining impurity material into the germanium through said opening to form a shallow region closely adjacent said face separated from the remainder of the wafer by a p-n junction which extends to said face beneath said silicon oxide coating, applying another coating of silicon oxide to the face of the wafer, forming a germanium oxide layer intermediate the area of emergence of said p-n junction at the face of said germanium wafer and said coating of silicon oxide, covering said face with a first coating of etch resistant material and defining at least one opening therein over said shallow region, etching away the coating of silicon oxide beneath said at least one opening, depositing a metal containing conductivity-determining impurity material over said another coating of silicon oxide and into said at least one opening, covering a small area of the deposited metal superimposed over said at least one opening with a second coating of etch resistant material without removing said first coating of etch resistant material, etching away the remainder of the deposited metal which remains exposed after covering said small area of the deposited metal, covering the face of the wafer with a third coating of etch resistant material and defining another small opening therein over the shallow region, etching away the silicon oxide coating beneath said another opening, depositing a metal containing conductivity-determining impurity material over said face and into said another opening, covering a small area of the deposited metal superimposed over said another opening with a fourth coating of etch resistant material without removing said third coating of etch resistant material, removing the deposited metal which remains exposed after covering with said fourth coating of etch resistant material said small area of the deposited metal superimposed over said another opening, and subjecting the wafer to an elevated temperature to fuse the deposited metal in said another opening into the shallow region to form an alloyed emitter region and to diffuse impurity material beneath the shallow region to form a base region.

12. A method of making a planar germanium transistor comprising coating a face of a P-type germanium wafer with a first coating of silicon oxide, defining a limited-area opening in said silicon oxide coating, diffusing a donor impurity material into the germanium through said opening to form a shallow N-type region closely adjacent said face separated from the remainder of the wafer by a p-n junction which extends to said face beneath said silicon oxide coating, applying a second coating of silicon oxide to the face of the wafer, forming a germanium oxide layer intermediate the area of emergence of said p-n junction at the face of said germanium wafer and said first coating of silicon oxide, covering the face of the wafer with a first coating of photoresist and defining at least one opening therein over the shallow N-type region, removing the second silicon oxide coating beneath said at least one opening by etching, depositing base contact metal over said face, covering a small area of the deposited base contact metal with a second layer of photoresist, spaced from said first layer of photoresist, removing the deposited contact metal which remains exposed after said small area is covered, covering said face with a third layer of photoresist and defining a small opening therein over said n-type region, removing the second silicon oxide coating beneath said small opening by etching, depositing a carrier metal containing fast diffusing donor impurity material and slow diffusing acceptor impurity material over said face and into said small opening, covering a small area of the deposited metal superimposed over said small opening with a fourth layer of photoresist, spaced from said third layer of photoresist, etching away the deposited metal which remains exposed after said fourth layer of photoresist is applied, and subjecting the wafer to an elevated temperature to fuse the deposited metal in said openings into said shallow region to form an alloyed emitter region of the transistor and low resistance base contact, and maintaining an elevated temperature to create a diffused N-type base region beneath the emitter region which is connected internally to said shallow N-type region but extends into the wafer further than said shallow region, depositing a third coating of silicon oxide over said face at a temperature substantially lower than used in diffusing said shallow region and in fusing said deposited metal, defining small openings in the third coating of silicon oxide over the deposited metal of the emitter and over the base contact metal, and forming separate base and emitter expanded contacts over said third coating of silicon oxide and extending into said small openings, the expanded contact areas being greater in size than the emitter region and base contacts.

References Cited

UNITED STATES PATENTS

| | | | |
|---|---|---|---|
| 2,981,877 | 4/1961 | Noyce | 317—235 |
| 3,206,827 | 9/1965 | Kreigsman | 29—578 |
| 3,237,271 | 1/1966 | Arnold | 29—578 |
| 3,312,577 | 4/1967 | Dunster et al. | 148—187 |

WILLIAM I. BROOKS, *Primary Examiner.*

U.S. Cl. X.R.

29—589; 148—187, 188